(12) United States Patent
Nicol et al.

(10) Patent No.: US 8,508,956 B2
(45) Date of Patent: Aug. 13, 2013

(54) MODULAR SHIELDED ELECTRONICS ENCLOSURE

(75) Inventors: David H. Nicol, Del Mar, CA (US); Michael Dugan Joyce, Chula Vista, CA (US); Brendan Burgess, Poway, CA (US)

(73) Assignee: CareFusion 303, Inc., San Diego, CA (US)

( * ) Notice: Subject to any disclaimer, the term of this patent is extended or adjusted under 35 U.S.C. 154(b) by 280 days.

(21) Appl. No.: 13/101,861

(22) Filed: May 5, 2011

(65) Prior Publication Data

US 2012/0281368 A1 Nov. 8, 2012

(51) Int. Cl.
*H05K 9/00* (2006.01)
*H05K 5/00* (2006.01)

(52) U.S. Cl.
USPC .......................... 361/818; 361/752; 361/816

(58) Field of Classification Search
None
See application file for complete search history.

(56) References Cited

U.S. PATENT DOCUMENTS

| | | | |
|---|---|---|---|
| 6,963,495 B1 * | 11/2005 | Carullo et al. | 361/818 |
| 7,113,410 B2 * | 9/2006 | Pawlenko et al. | 361/818 |
| 7,450,388 B2 * | 11/2008 | Beihoff et al. | 361/715 |
| 2003/0174474 A1 * | 9/2003 | Mair et al. | 361/752 |
| 2004/0223309 A1 * | 11/2004 | Haemer et al. | 361/767 |
| 2004/0252254 A1 | 12/2004 | Koo et al. | |
| 2008/0123016 A1 | 5/2008 | Kwak et al. | |
| 2009/0201660 A1 | 8/2009 | Kim | |

OTHER PUBLICATIONS

International Search Report and Written Opinion for PCT/US2012/034722, mailed Nov. 20, 2012.

* cited by examiner

*Primary Examiner* — Hoa C Nguyen
*Assistant Examiner* — Xanthia C Cunningham
(74) *Attorney, Agent, or Firm* — McDermott Will & Emery LLP

(57) ABSTRACT

A modular electronics enclosure for reducing electromagnetic interference (EMI) is disclosed. The electronics assembly includes a first electronic component having an output, a second electronic component having an input with an input impedance, and a circuit matching element having an input coupled to the output of the first electronic component and an output coupled to the input of the second electronic component. The output of the circuit matching element is configured to provide an output impedance that matches the input impedance of the second electronic component. The electronics assembly also includes a conductive surface that forms a volume that encloses the first electronic component and the circuit matching element. All non-conductive passages from the volume to the external environment have at least one cross-sectional opening having a continuous conductive perimeter with a maximum linear length within the opening of less than one quarter wavelength of a maximum shielding frequency.

31 Claims, 7 Drawing Sheets

MODULAR SHIELDED ELECTRONICS ENCLOSURE

BACKGROUND

1. Field

The present disclosure generally relates to systems and methods of mounting electrical components and, in particular, modularizing electronics while providing ElectroMagnetic Interference (EMI) shielding.

2. Description of the Related Art

Hospitals have a need to provide secure storage for certain medications, such as narcotics and controlled substances, while still making the medications available to care givers. One method of providing this secure storage is the use of Automatic Dispensing Machines (ADMs), which typically contain a microprocessor that is functionally connected to the hospital data systems and lockable drawers and compartments containing the medications. The software of each ADM is normally configured to allow access to the medications only after certain requirements are met, such as verification that the individual requesting the medication is authorized to do so. The ADMs should be continuously operational as hospitals must provide care to their patients 24 hours a day.

Computer processors and motherboards that may be used in such systems are known to emit electromagnetic radiation across a wide frequency band due to the high frequency digital signals conducted through the circuits of the processor and on the board. To meet regulatory requirements that limit the amount of electromagnetic energy that can be radiated from electronic devices, motherboards are frequently mounted inside conductive enclosures. As electromagnetic radiation is sometimes emitted from conductors connected between the motherboard and other electronic components, the conductive enclosure is often the entire outer case of the electronics. Providing a conductive enclosure of this size with EMI seals around all access openings is more expensive that an enclosure for just the motherboard and makes access to the electronics for repair and replacement more complicated.

SUMMARY

There is a need to improve the operation of an ADM by providing an easily-removed modular electronics enclosure that also provides EMI shielding around electronic components that generate EMI and limit the radiated electromagnetic energy from cables that are connected to the electronic components within the enclosure.

The disclosed system provides a modular electronics enclosure that incorporates EMI shielding for the enclosed electronics as well as reducing the electromagnetic radiation emitted by conductors that connect the enclosed electronics to components outside the shielded volume. In the system, the electronics are mounted on a first sled that forms a part of a shielded enclosure, wherein the first sled couples to an interface board that includes circuitry that matches the impedance of at least one external circuit thereby limiting the electromagnetic radiation emitted by the at least one external circuit.

In certain embodiments, a modular electronics assembly for reducing EMI is disclosed that includes a first electronic component having an output, a second electronic component having an input with an input impedance, and a circuit matching element having an input coupled to the output of the first electronic component and an output coupled to the input of the second electronic component. The output of the circuit matching element is configured to provide an output impedance that matches the input impedance of the second electronic component. The electronics assembly also includes a conductive surface that forms a volume that encloses the first electronic component and the circuit matching element. All non-conductive passages from the volume to the external environment have at least one cross-sectional opening having a continuous conductive perimeter with a maximum linear length within the opening of less than one quarter wavelength of a maximum shielding frequency.

In certain embodiments, an electronics assembly for removably connecting an electronic assembly to at least one external device while reducing EMI emissions is disclosed. The electronics enclosure includes a conductive sled configured to accept first and second electronic components, the first electronic component comprising an electrical interface connector configured to removably mate with a docking connector coupled to the at least one external device, the second electronic component having an input impedance. The electronics assembly also includes a circuit matching element coupled between the first and second electronic components. The circuit matching element is configured to provide an output impedance that matches the input impedance of the second electronic component. The electronics assembly also includes a component and the circuit matching element. All non-conductive passages from the volume to the external environment have at least one cross-sectional opening having a continuous conductive perimeter with a maximum linear length within the opening of less than one quarter wavelength of a maximum shielding frequency.

In certain embodiments, an All-In-One (AIO) assembly for a medical device is disclosed. The AIO assembly includes an external shell, a touchscreen coupled to the shell, and a conductive sled coupled to the shell. The sled is configured to mechanically couple to the medical device. The AIO assembly also includes a display unit coupled to the conductive sled. The display unit includes a Liquid Crystal Display (LCD) and a backlight. The LCD has an input with an input impedance. The sled is configured to locate the LCD and backlight proximate to the touchscreen when the sled is coupled to the shell. The AIO assembly also includes a motherboard coupled to the sled. The motherboard comprising a processor and a low-voltage differential signal (LVDS) driver. The AIO assembly also includes a breakout board coupled to the sled. The breakout board has an input coupled to the LVDS driver and an output coupled to the input of the display. The breakout board output is configured to provide LVDS signals with an output impedance that matches the input impedance of the LCD. The AIO assembly also includes a conductive cover coupled to the sled to form a volume that encloses the motherboard and the breakout board. All non-conductive passages from the volume to the external environment have at least one cross-sectional opening having a continuous conductive perimeter with a maximum linear length within the opening of less than one quarter wavelength of a maximum shielding frequency.

In certain embodiments, an Automated Dispensing Machine (ADM) is disclosed that includes a housing, at least one compartment coupled to the housing, the compartment configured to allow access to the contents of the compartment only after receipt of a signal, and an AIO assembly coupled to the housing. The AIO includes an external shell, a touchscreen coupled to the shell, and a conductive sled coupled to the shell. The sled is configured to mechanically couple to the medical device. The AIO assembly also includes a display unit coupled to the conductive sled. The display unit comprising a Liquid Crystal Display (LCD) and a backlight. The LCD has an input with an input impedance. The sled is configured to locate the LCD and backlight proximate to the touchscreen when the sled is coupled to the shell. The AIO assembly also includes a motherboard coupled to the sled. The motherboard comprising a processor, a LVDS driver, and an interface connector configured to removably engage a docking connector coupled to the at least one compartment. The AIO assembly also includes a breakout board coupled to the sled, the breakout board having an input coupled to the LVDS driver and an output coupled to the input of the display. The breakout board output is configured to provide LVDS signals with an output impedance that matches the input impedance of the LCD. The AIO assembly also includes a conductive cover coupled to the sled to form a volume that encloses the motherboard and the breakout board. All non-conductive passages from the volume to the external environment have at least one cross-sectional opening having a continuous conductive perimeter with a maximum linear length within the opening of less than one quarter wavelength of a maximum shielding frequency. The AIO assembly is configured to be removable from the ADM without disassembly of the external shell.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

DETAILED DESCRIPTION

Figure 1:
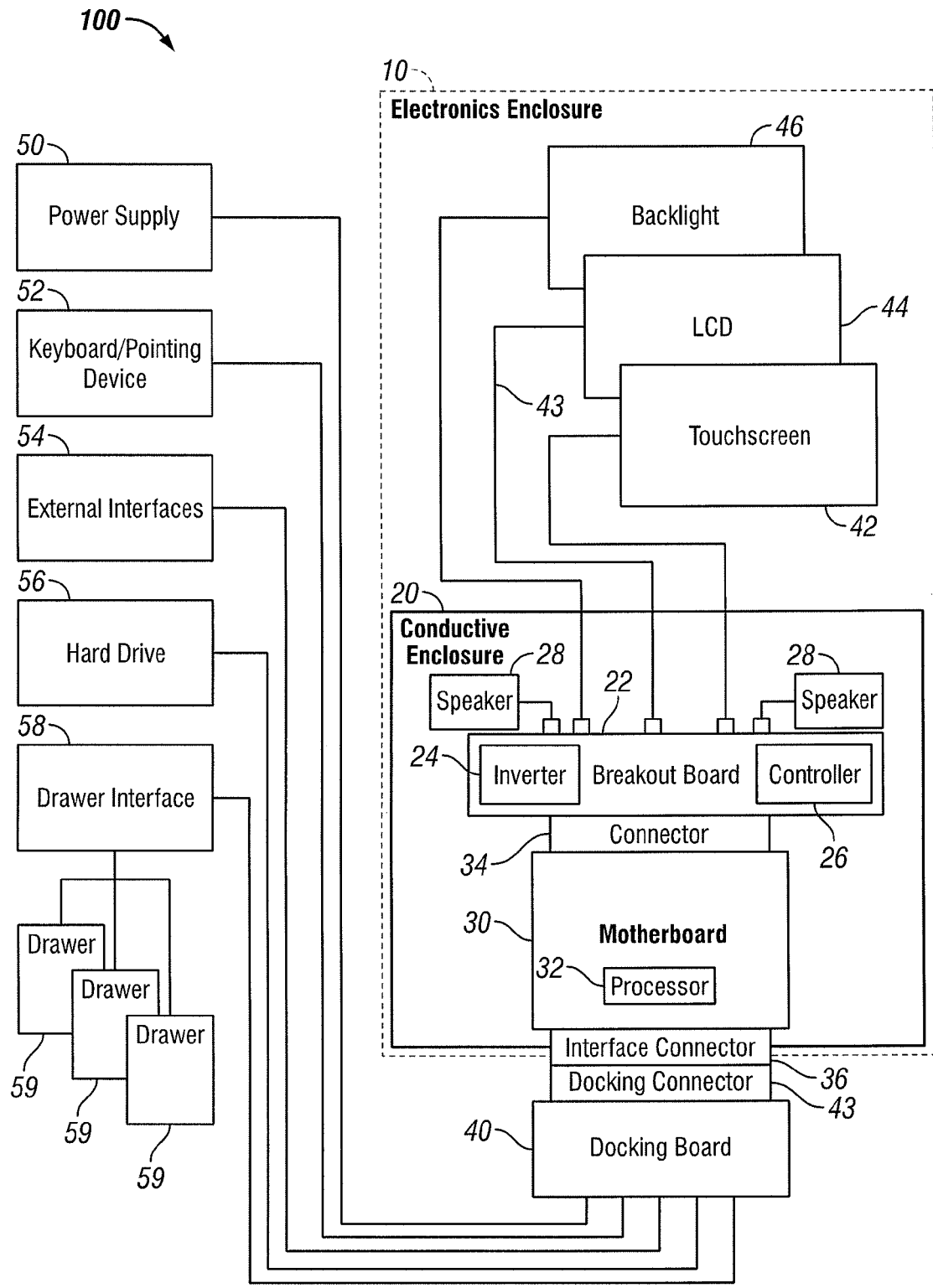
FIG. 1 is a block diagram of an embodiment of an ADM according to certain aspects of this disclosure.

The following description discloses embodiments of an electronics enclosure that includes a modular assembly that encloses certain electronics while providing EMI shielding of the electronics to meet regulatory requirements on electromagnetic emissions. The modular assembly is configured such that EMI emissions are reduced on lines that are connected to electronic components within the module that may emit EMI.

In the following detailed description, numerous specific details are set forth to provide a full understanding of the present disclosure. It will be apparent, however, to one ordinarily skilled in the art that embodiments of the present disclosure may be practiced without some of the specific details. In other instances, well-known structures and techniques have not been shown in detail so as not to obscure the disclosure.

The method and system disclosed herein are presented in terms of an enclosure of a motherboard with an attached microprocessor as part of a computer system such as used in an ADM. It will be obvious to those of ordinary skill in the art that this same configuration and method can be utilized in a variety of applications enclosing a range of electronic assemblies that require both EMI shielding and cooling. Nothing in this disclosure should be interpreted, unless specifically stated as such, to limit the application of any method or system disclosed herein to a medical environment or to the dispensing of medications.

Electromagnetic radiation emitted by electronics are controlled by various regulatory agencies in countries around the world. In the United States, these regulations are currently embodied in the Code of Federal Regulations, Title 47, Part 15 (47 CFR 15) and administered by the Federal Communications Commission (FCC). For "unintentional radiators with a digital device", which generally includes computers and products that include microprocessors, the FCC has established maximum levels of emitted radiation over a range of frequencies having an upper frequency of 40 GHz if the device operates at a frequency above 1 GHz. Different levels of standards are provided for different environments. The Class B standard applies to equipment marketed for use in the home, even if it could be used elsewhere. Home users are likely to be annoyed by interference to TV and radio reception. Class A is a looser standard for equipment intended only for business, industrial and commercial settings. Some manufacturers design their products to comply with Class B requirements even when the products are intended for business environments.

In the medical field, automating compliance with various safety standards has been recognized as saving labor on the part of the clinician staff as well as increasing the compliance rate, thereby increasing patient safety. To accomplish this automation, some medical devices contain microprocessors and peripheral devices of the sort used in personal computers (PCs), including Liquid Crystal Displays (LCDs) and hard drives, as well as other specialized and custom hardware devices. For example, an ADM such as the Pyxis® Medstation® 4000 contains a microprocessor that communicates with the hospital data systems and a user interface that includes an LCD display with a touchscreen.

One of the challenges in designing equipment that contains electronics such as a computer motherboard with a processor and, in particular, a video display that is driven by a digital signal is that the digital signals radiate electromagnetic energy at their clock frequency and harmonics of the clock frequency. One approach to meeting the regulatory requirements has been to place all of the interconnected electronics within a conductive case, forming a Faraday cage that contains the emitted EMI. A standard personal computer (PC) case is an example of this design approach, where the motherboard, video cards, hard drives, and power supply are all placed in a single case that is either metal or has a conductive layer to form the conductive enclosure. One drawback to this approach is that servicing any component requires opening the case, with the risk of damage or misassembly of the EMI seals when the case is opened and closed. In addition, the size of the enclosure required to house all of the components increases the overall cost of the system. Cables that exit the case may include ferrites that serve to block the higher frequency components of the signal. While the use of ferrites can be effective in reducing EMI emissions, ferrites also can distort the digital signals and reduce the signal strength as well as add cost and complexity to the design. There is a need for a system that provides adequate EMI shielding and adequate cooling of electronics while reducing costs and improving the serviceability of the components and, in particular, the speed with which a malfunctioning system can be restored to service.

Certain medical devices, such as an ADM, incorporate an AIO assembly that includes an external plastic housing, an internal metal structural housing, and a removable sled. The touch screen is mounted to the external plastic housing. The LCD assembly is mounted into the tray of the metal internal structural housing. The breakout board, speakers, LCD inverter, and touch screen driver are mounted to tray section of the internal metal housing. The sheet metal pan mounts onto the tray and with the tray forms the Faraday enclosure. The sled which carries the CPU and support electronics slides into the Faraday enclosure. To create an enclosed volume for the Faraday cage, this sled is electrically connected to the internal metal housing. The AIO assembly also includes a display panel assembly which is mounted into the metal tray. The display panel assembly incorporates a LCD and a backlight. The LCD uses LVDS as the electrical interconnect to the video driver. LVDS has a characteristic impedance which must be matched for efficient data transfer and to minimize radiated emissions. The shell is configured to locate the LCD and backlight proximate to the touchscreen which is located in front of the LCD. The sled carries the motherboard comprising a CPU, support chips, memory and the LVDS driver integrated circuit. The CPU board, mounted onto the sled, plugs into the tray mounted breakout board. The breakout board couples the LVDS driver output from the CPU board to the input of the LCD. The electrical layout of the breakout board is designed to match the output impedance of LVDS signals from the CPU board to the input impedance of the LCD module. All non-conductive passages from the volume of the Faraday cage to the external environment has a continuous conductive perimeter with a maximum linear length within the opening of less than one quarter wavelength of a maximum shielding frequency.

FIG. 1 is a block diagram of an embodiment of an ADM 100 according to certain aspects of this disclosure. The ADM 100 includes an electronics enclosure 10 that is coupled through a docking board 40 to a power supply 50, keyboard/pointing device 52, external interfaces 54 such as wired or wireless Ethernet networks, a hard drive 56 or other non-transient storage device such as a flash memory, and a drawer interface 58 that is further connected to at least one drawer 59.

The electronics assembly 10 includes a conductive enclosure 20 that encloses a motherboard 30 with, in this example, a processor 32, the motherboard 30 connected to a breakout board 22 through a connector 34. The conductive enclosure 20 also contains, in this embodiment, speakers 28. The breakout board 22, in this embodiment, includes an inverter 24 that is coupled to the backlight 46, and a controller 26 that is coupled to the LCD 44.

In the system disclosed herein, only the components generating EMI are contained in a Faraday cage. In addition, certain components are mounted on an easily removed sled to facilitate replacement.

In certain embodiments, components handling digital signals create excessive amounts of EMI and therefore require shielding. In the embodiment of FIG. 1, the digital signals on the motherboard 30 and the Low Voltage Differential Signal (LVDS) digital video signal from the controller 26 are the sole sources of excessive EMI. The motherboard 30 and controller 26 are enclosed in the conductive enclosure 20, thereby containing the EMI that is radiated directly by these components. The digital video signal, however, must be carried to the LCD 44. If LVDS signal is sent out on a standard parallel-wire cable 43, the cable 43 will act as an antenna and radiate EMI.

To prevent the video cable 43 from radiating EMI, the breakout board 22 of FIG. 1 comprises impedance-matching circuitry (not shown separately) for at least one of the cables that exits the conductive enclosure 20. In certain embodiments, the impedance-matching circuit accepts the video signal from the controller 26 and transmits the video signal to the LCD 44 through cable 43. The cable 43 and the LCD 44 will have a characteristic input impedance at the interface to the breakout board 22. The impedance matching circuitry of the breakout board 22 provides an output having an output impedance that matches the input impedance of the LCD 44 and cable 43 such that the energy of the signal is well-coupled to the circuitry of LCD 44 and the amount of energy available to radiate from the cable 43 as EMI is reduced. This impedance matching eliminates the need for inductive filtering elements, for example a ferrite, to be coupled to the cable 43 to meet the regulatory requirements. In certain embodiments, impedance-matching circuits are provided for other external cables.

It can be seen in FIG. 1 that the motherboard 30 is connected to the breakout board 22 through a connector 34. This simplifies replacement of the motherboard 30 as is discussed in greater detail with respect to FIGS. 2-7.

It can also be seen in FIG. 1 that the entire electronics enclosure 10 is coupled to a plurality of external components through connectors 36, 42 and a docking board 40. This simplifies the replacement of the entire enclosure 10 as is discussed in greater detail with respect to FIG. 7.

Figure 2:
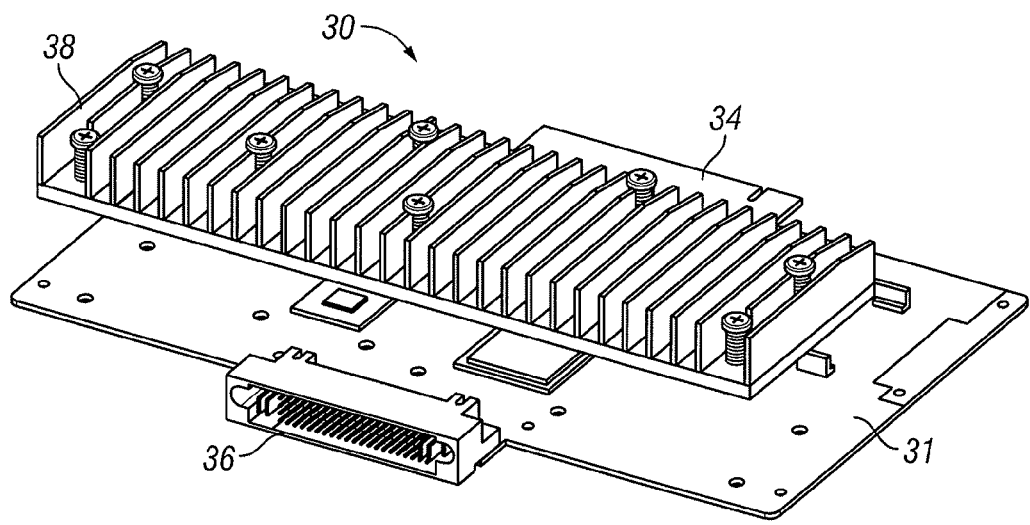
FIG. 2 is a perspective view of a motherboard configured to be enclosed by a conductive enclosure according to certain aspects of this disclosure.

FIG. 2 is a perspective view of a motherboard 30 configured to be enclosed by a conductive enclosure 20 according to certain aspects of this disclosure. The motherboard 30 has a substrate board 31 and includes a connector 34 to couple to the breakout board 22 within the conductive enclosure 20 and an external connector 36 to couple to the docking board 40. This embodiment of the motherboard 30 has a passive heatsink 38 positioned adjacent to the external connector 36. The position of the heatsink 38 is discussed in more detail with respect to FIG. 7.

Figure 3:
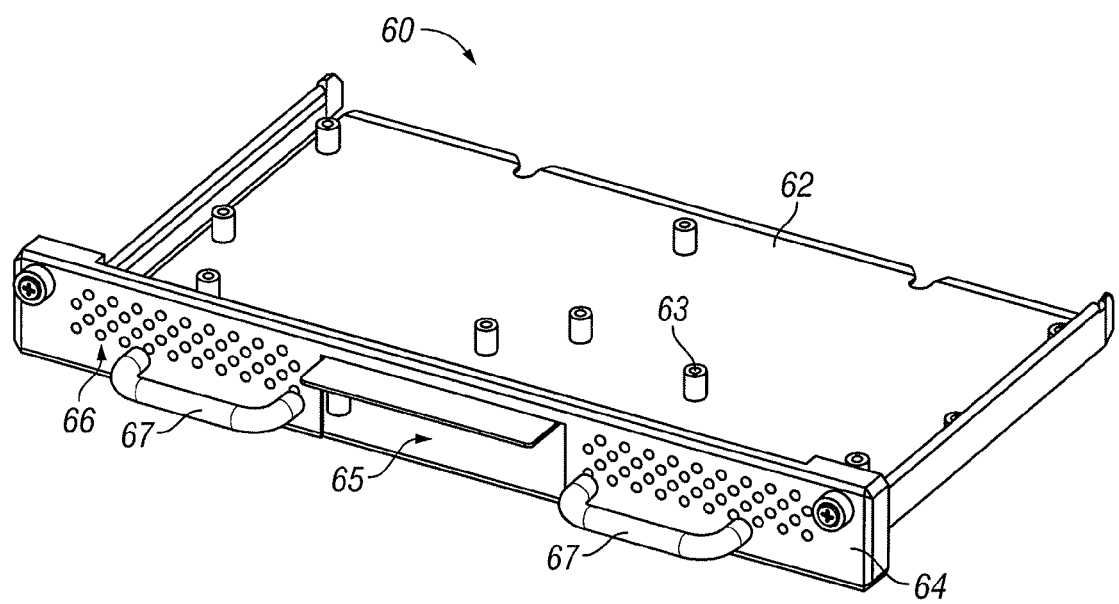
FIG. 3 is a perspective view of a sled configured to form part of a conductive enclosure according to certain aspects of this disclosure.

FIG. 3 is a perspective view of a sled 60 configured to form part of a conductive enclosure 20 according to certain aspects of this disclosure. The sled 60 includes a base 62 with multiple standoffs 63 configured such that the motherboard 30 can be attached to the base 62. The sled 60 also includes a faceplate 64 with a plurality of ventilation openings 66. The function of the faceplate 64 and openings 66 is discussed in greater detail with respect to FIG. 7. The faceplate 65 also has an opening 65 positioned such that connector 36 of the motherboard 30 projects through the opening 65. The sled 60 also includes, in this embodiment, two handles 67 to facilitate removal of the sled 60 as is discussed in greater detail with respect to FIG. 7.

Figure 4:
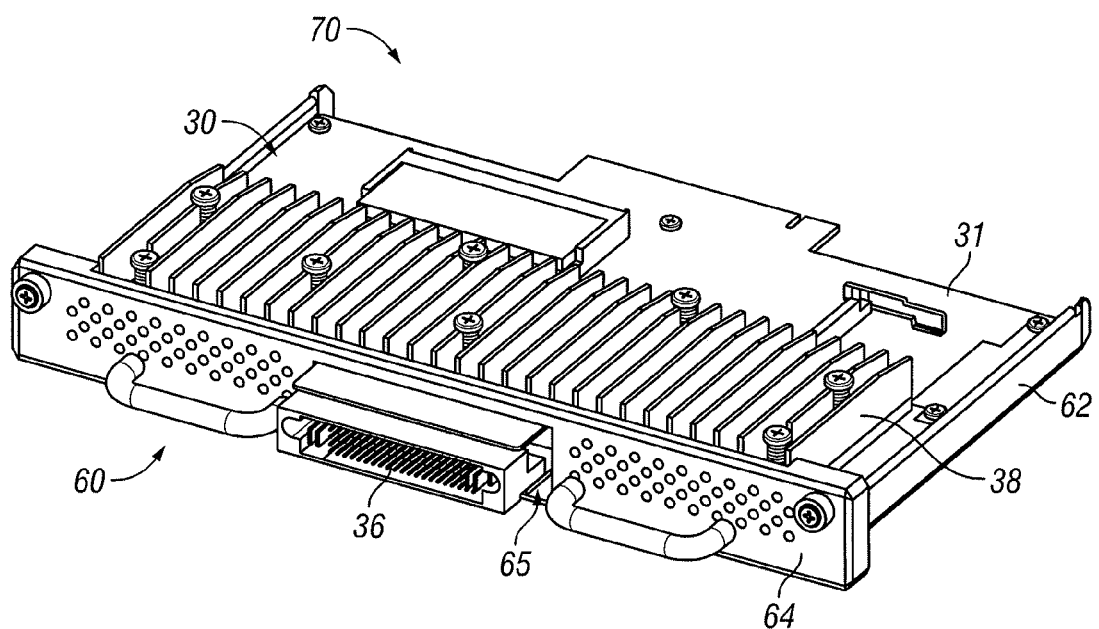
FIG. 4 depicts the motherboard of FIG. 2 assembled with the sled of FIG. 3 to form a sled assembly according to certain aspects of this disclosure.

FIG. 4 depicts the motherboard 30 of FIG. 2 assembled with the sled 60 of FIG. 3 to form a sled assembly 70 according to certain aspects of this disclosure. It can be seen that, in this embodiment, the base 62 projects beyond the perimeter of the board substrate 31 and that external connector 36 projects through the opening 65 of sled 60. In certain embodiments, the faceplate 64 contacts the tops of the fins 39 of heatsink 38, which is discussed further with respect to FIG. 7.

Figure 5:
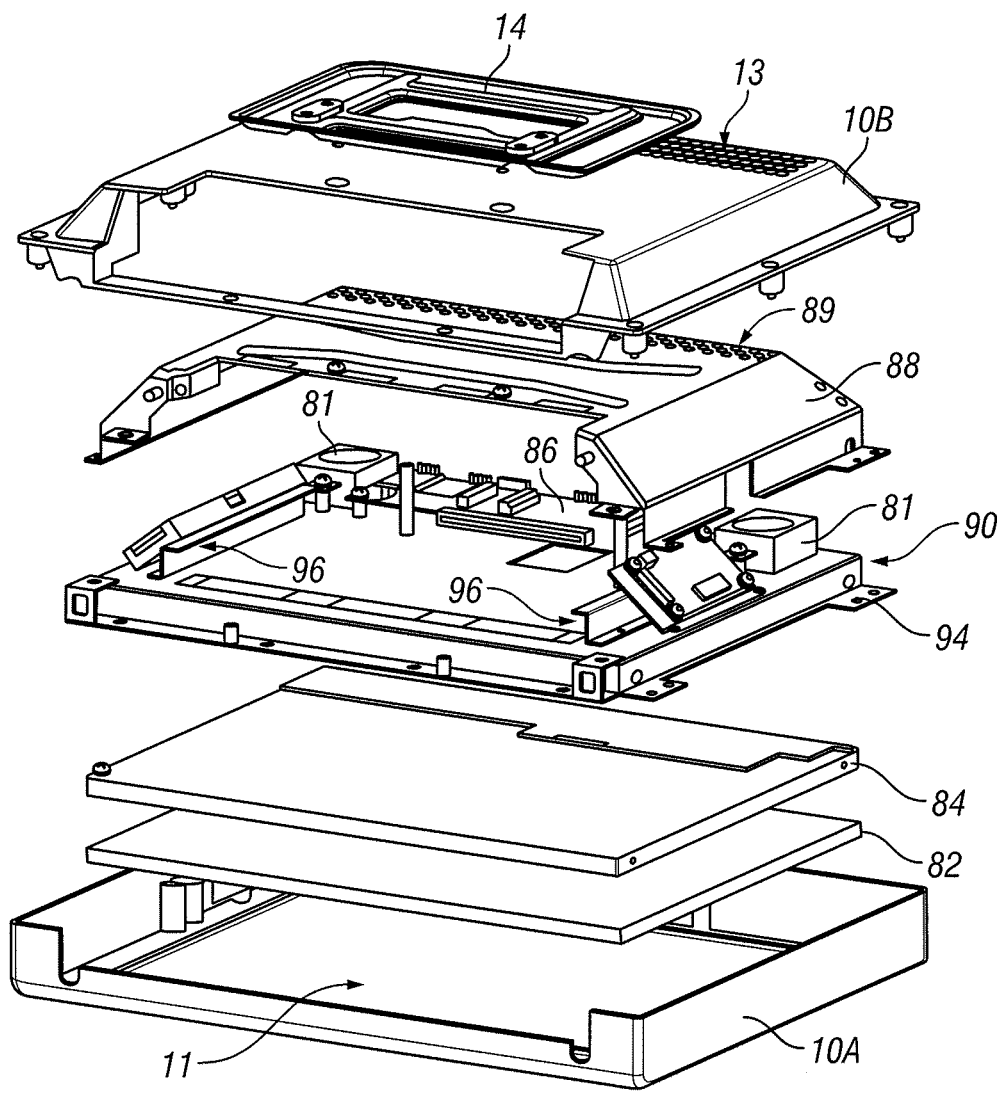
FIG. 5 depicts an exploded view of an electronics enclosure according to certain aspects of this disclosure.

FIG. 5 depicts an exploded view of an electronics enclosure 10 according to certain aspects of this disclosure. In certain embodiments, the electronics enclosure 10 is assembled in the order described herein. In certain embodiments, components are assembled in subassemblies in a different order. In the embodiment of FIG. 5, a front enclosure 10A is placed facedown on an assembly surface (not shown). The front enclosure 10A, in this embodiment, does not include a conductive surface. A touchscreen 82 is positioned over the opening 11. In certain embodiments, a foam cushion is disposed between the touchscreen 82 and front enclosure 10A. A display panel 84, which includes a LCD panel 44 and a backlight 46 (not shown separately in FIG. 5), is positioned over the touchscreen and the opening 11. A support plate 90 is placed over the display panel 84 and fastened to the front enclosure 10A through flanges 94. The support plate 90 is configured to secure the display panel 84 and touchscreen 82 in place. Breakout board 86 is, in this embodiment, attached to the support plate 90. The support plate 90 also incorporates slots 96 on two sides configured such that sled 60 will slide into the slots 96. The breakout board 86 is positioned on the support plate 90 such that the connector 34 of the sled assembly 70 will mate with the breakout board 86 when the sled assembly 70 is fully inserted into the slots 96. In this embodiment, speakers 81 are also mounted in support plate 90.

A conductive cover 88 with ventilation holes 89 is attached to support plate 90. The conductive cover 88 mates with the support plate 90 to form a shell that is a portion of the conductive enclosure 20. The conductive enclosure 20 is designed to provide EMI shielding up to a maximum shielding frequency, which can be determined. In certain embodiments, the maximum shielding frequency is 40 GHz in accordance with the upper end of the frequency band currently regulated by the FCC. In certain embodiments, the maximum shielding frequency is determined to be lower than 40 GHz based on the measured EMI emissions from the specific electronics to be contained in the conductive enclosure 20. In certain embodiments, the maximum shielding frequency is 1 GHz. In these embodiments, the conductive cover 88 is configured such that all openings at the corners or joints have a cross-sectional opening with a maximum linear length within the opening of less than one quarter wavelength of the maximum shielding frequency. The maximum linear length is the length of a straight line that can be formed across the clear opening without crossing a conductive boundary. In certain embodiments, an opening having a maximum linear length of less than one quarter wavelength of a determined frequency provides sufficient attenuation of signals at frequencies less that the determined frequency to meet regulatory requirements.

In certain embodiments, the conductive cover 88 and the support plate 90 form the structural members of the electronics enclosure 10. This is discussed in greater detail with respect to FIG. 7A. An attachment feature 14 is attached to the conductive cover 88 through the read enclosure 10B. In certain embodiments, portions of the rear enclosure 88 are placed in compression between the attachment feature 14 and conductive cover 88, but the conductive cover 88 carries no tension, bending, or shear loads. One aspect of the lack of load-carrying or EMI shielding function of the front and rear enclosures 10A, 10B is that they can be replaced with alternate designs for use in other products without affecting the structural or EMI performance or certification of the electronics enclosure 10. In this embodiment, the rear enclosure 10B attached to the front enclosure 10A.

Figure 6:
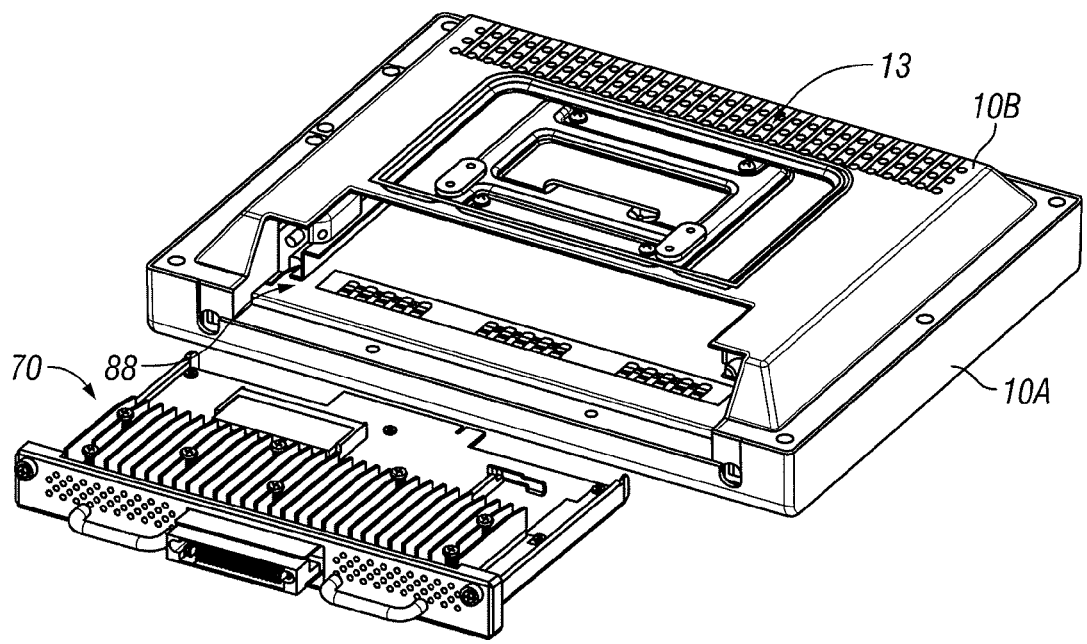
FIG. 6 is a perspective view of a partially assembled electronics enclosure according to certain aspects of this disclosure.

FIG. 6 is a perspective view of a partially assembled electronics enclosure 10 according to certain aspects of this disclosure. FIG. 6 depicts the assembly of FIG. 5 with the sled assembly 70 of FIG. 4. It can be seen how the sled assembly 70 will slide through the openings in the rear enclosure 10B and into the slots of the conductive cover 88.

Figure 7A:
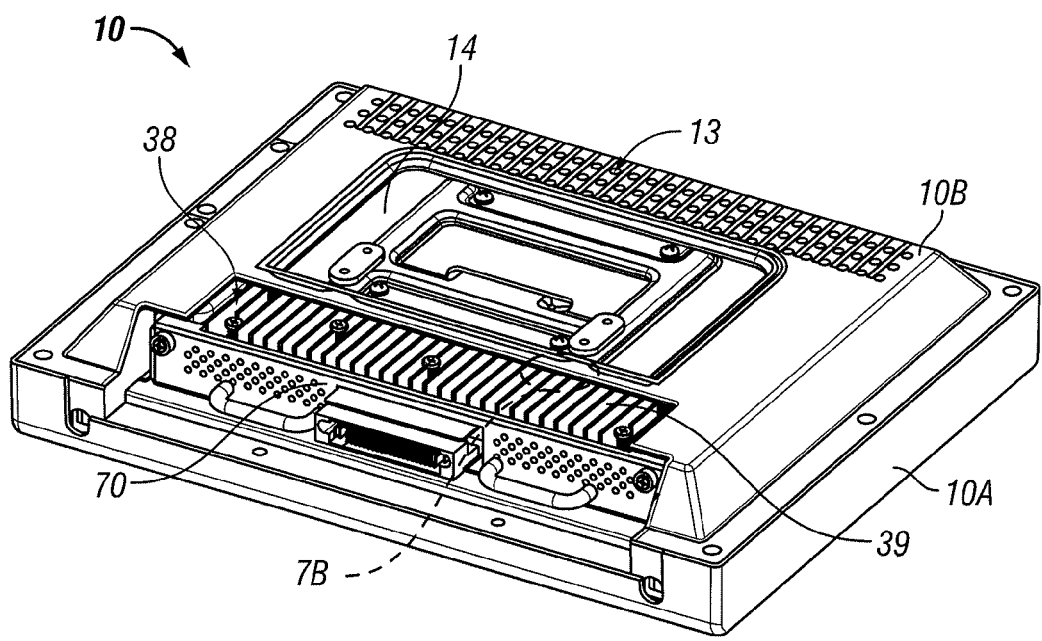
FIG. 7A depicts a fully assembled electronics enclosure according to certain aspects of this disclosure.

FIG. 7A depicts a fully assembled electronics enclosure 10 according to certain aspects of this disclosure. The electronic enclosure 10 includes the sled assembly 70 of FIG. 4 that has been slid into the slots 96 (not visible in FIG. 7A) until the connector 34 mates with the breakout board 22 and the faceplate 64 is in contact with the conductive cover 88 and support plate 90 to form the conductive enclosure 20. In this embodiment, the rear enclosure 10B and the conductive cover 88 are configured to expose the fins 39 of heat sink 38, with the conductive cover 88 in contact with the fins 39 on one side and the faceplate 64 in contact with the fins 39 on the other side. In this embodiment, air can flow between the fins 39 of the heat sink 38 as well as in through the openings 66 in face plate 64 to cool the electronics and then through the volume within the conductive enclosure 20 and out through the openings 89 and 13. The area indicated by the broken-line circle 7B is enlarged and the shielding in this area is discussed in more detail with respect to FIG. 7B.

Replacement of the motherboard 30 achieved by sliding the sled assembly 70 out of the electronics assembly 10. As the sole electrical connection of the motherboard 30 to the breakout board 22 is through connector 32, no cables need be unplugged and, therefore, there is no risk of damage to cables, connecting a cable incorrectly, or leaving a cable disconnected. An alternate motherboard (not shown) can be substituted for the existing motherboard 30 by redesigning the sled 60 to accommodate the alternate motherboard, as long as the alternate motherboard has equivalent connectors 34 and 36.

Rear enclosure 10B also includes an attachment feature 14 that is fastened through the rear enclosure 10B to the conductive cover 88. The attachment feature 14 is configured to attach to a structural support of an external system such as the ADM of FIG. 8. In certain embodiments, the electronics enclosure 10 is attached to a support arm (not shown).

As the electronics enclosure 10 contains the processor 32, the touchscreen 42, and a display comprised of the LCD 44 and backlight 46, the electronics enclosure 10 may be referred to as an "All-In-One" or AIO unit.

Figure 7B:
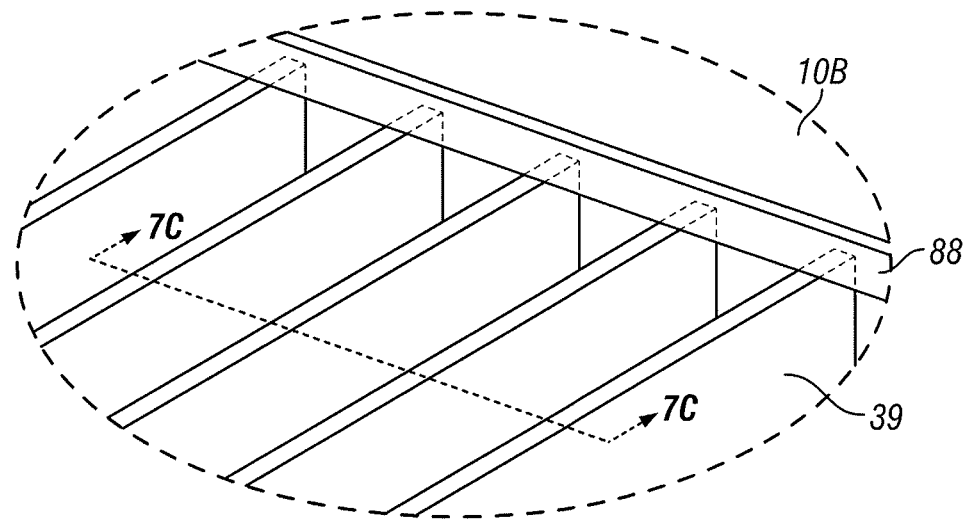
FIGS. 7B and 7C depict the effective shielding provided at the heat sink 38 according to certain aspects of this disclosure.
Figure 7C:
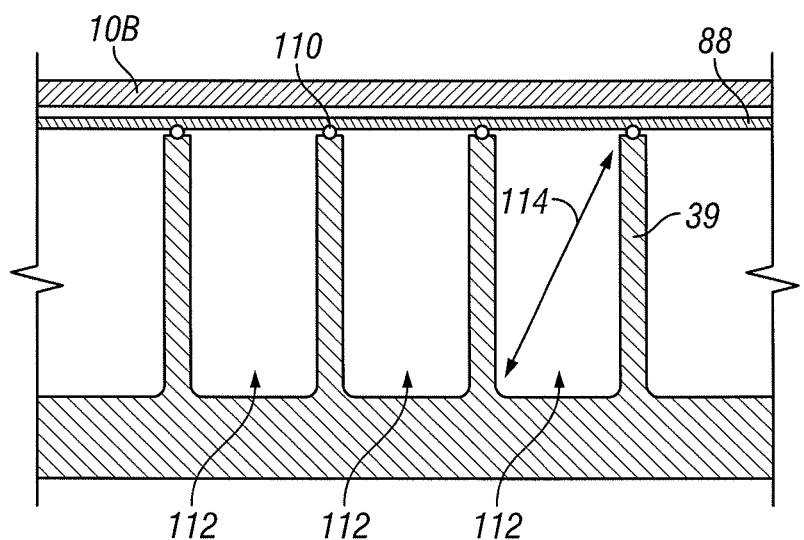

FIGS. 7B and 7C depict the effective shielding provided at the heat sink 38 according to certain aspects of this disclosure. In FIG. 7B, it can be seen that the conductive cover 88 overlaps the fins 39 when the sled assembly 70 is fully inserted in the electronic enclosure 10. In certain embodiments, the conductive cover 88 is in electrical contact with the tops of the fins 39, thereby separating the spaces between adjacent fins 39 into separate openings.

FIG. 7C is a cross-section of the same area depicted in FIG. 7B, as viewed according to the section line 7C-7C in FIG. 7B. It can be seen that the cosmetic cover 10B overlays the conductive cover 88. The conductive cover 88 makes electrical contact with the fins 39 at points 110. The fins 39 are configured with a spacing and fin height such that the openings between the fins 39 form cross-sectional openings 112 at the point where the conductive cover 88 contact the fins 39. The openings 112 have a maximum linear length 114 within the opening 112 of less than one quarter wavelength of the maximum shielding frequency provided by this opening.

Figure 8:
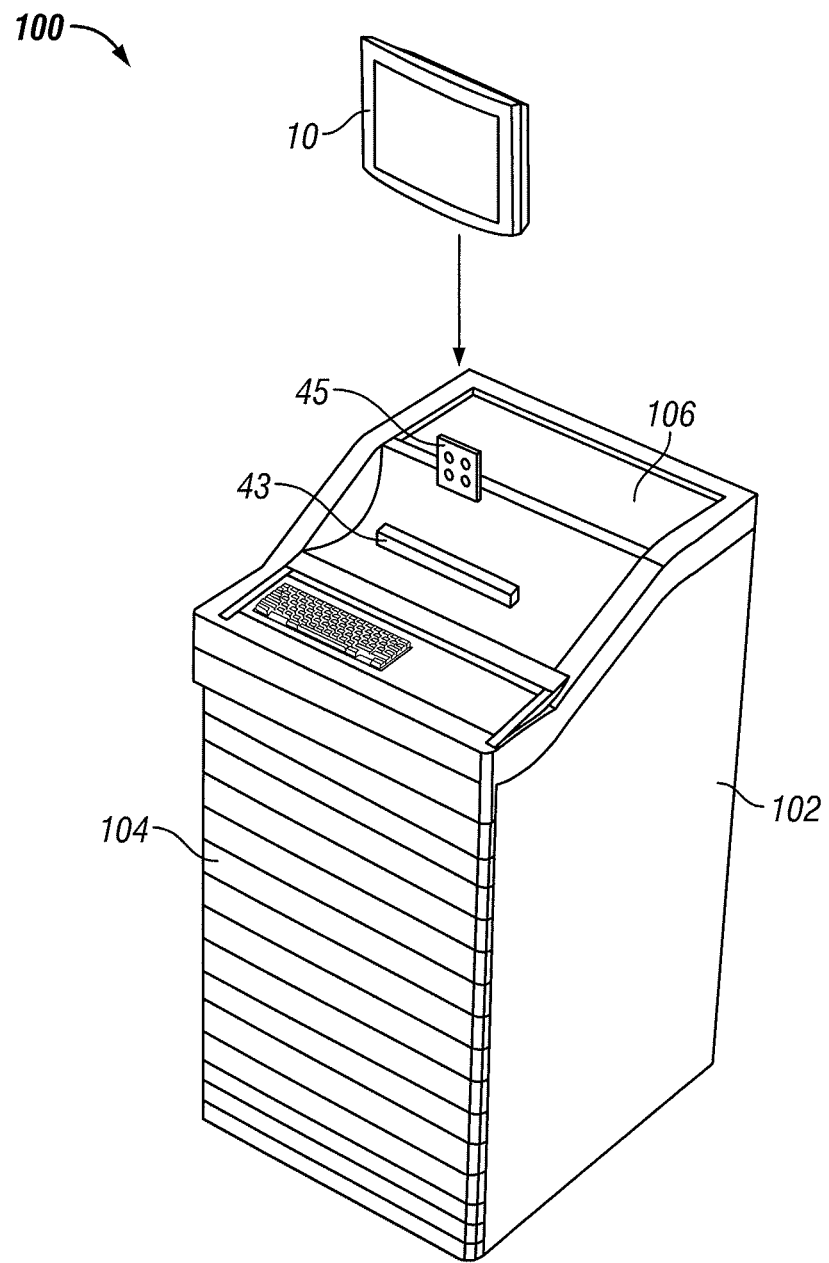
FIG. 8 depicts an ADM incorporating an electronics enclosure according to certain aspects of this disclosure.

FIG. 8 depicts an ADM 100 incorporating an electronics enclosure 10 according to certain aspects of this disclosure. This embodiment of the ADM 100 includes a housing 102, drawers 104, and a cover 106 to which a mounting interface 45 is attached. Mounting interface 45 is configured to accept, in this embodiment, the attachment feature 14 that is located on the rear of the electronics enclosure 10 and guide the external connector 36 (not visible in FIG. 8) into proper position to couple with docking connector 43 that is also attached to cover 106. In certain embodiments, bolts (not shown) are inserted from the inside of the cover 106 into the attachment feature 14 to secure the electronics enclosure 10 to the cover 106.

In the event of a failure of the LCD 44, touchscreen 42, or processor 32, the entire electronics enclosure 10 is removed from the ADM 100 by removal of the securing bolts (if used) and sliding the electronics enclosure 10 away from docking connector 43. A new electronics enclosure 10 can be installed or, if the motherboard 30 or processor 32 are defective, for example, the sled assembly 70 can be removed and replaced. These two levels of modular assembly, the electronics enclosure 10 and the sled assembly 70, enhance the ability to quickly return the ADM 100 to service.

As the non-volatile memory, the hard drive 56 in this embodiment, is located external to the electronics enclosure 10, replacement of either the electronics enclosure 10 or the sled assembly 70 does not require reloading of software or reconfiguration of the system as the operating system, software, settings, configuration data, and databases may remain in the undisturbed hard drive 56.

The disclosed electronics enclosure provides a modular assembly having EMI shielding and including impedance-matching circuits that together reduce the radiated emissions of EMI from enclosed electronic components. In certain embodiments, the electronics enclosure has an external connector and attachment feature that allows the electronics enclosure to be removable from a larger assembly without requiring manual demating of individual cables, wires, or connectors. In certain embodiments, some electronic components are mounted on a removable sled that, when installed in the electronics enclosure, removably couple an electrical connector and also complete the conductive enclosure surrounding the electronic components to be shielded.

The previous description is provided to enable a person of ordinary skill in the art to practice the various aspects described herein. While the foregoing has described what are considered to be the best mode and/or other examples, it is understood that various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the terms "a set" and "some" refer to one or more. Pronouns in the masculine (e.g., his) include the feminine and neuter gender (e.g., her and its) and vice versa. Headings and subheadings, if any, are used for convenience only and do not limit the invention.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A modular electronics assembly for reducing electromagnetic interference (EMI), the electronics assembly comprising:
   a first electronic component having an output;
   a second electronic component having an input with an input impedance;
   a circuit matching element having an input coupled to the output of the first electronic component and an output coupled to the input of the second electronic component, the output of the circuit matching element configured to provide an output impedance that matches the input impedance of the second electronic component;
   a conductive surface configured to form a volume, the first electronic component and the circuit matching element disposed within the volume;
   wherein all non-conductive passages from the volume to the external environment have at least one cross-sectional opening having a continuous conductive perimeter with a maximum linear length within the opening of less than one quarter wavelength of a maximum shielding frequency.

2. The electronics assembly of claim 1, wherein:
   the second electronic component comprises a display; and
   the output of the first electronic component comprises a video signal.

3. The electronics assembly of claim 1, wherein:
   the input of the second electronic component is configured to accept a Low Voltage Differential Signal (LVDS) signal;
   the input of the second electronic component has a characteristic input impedance; and the output of the circuit matching element is configured to provide a LVDS signal having an output impedance that matches the characteristic impedance of the second electronic component input.

4. The electronics assembly of claim 3, wherein no inductive element is coupled to the line between the circuit matching element output and the second electronic component input.

5. The electronics assembly of claim 4, wherein no ferrite is coupled to the line between the circuit matching element output and the second electronic component input.

6. The electronics assembly of claim 1, wherein the maximum shielding frequency is at least 1 GHz.

7. The electronics assembly of claim 1, further comprising:
a sled configured to accept the first electronic component and the circuit matching element, the sled comprising a conductive material; and
a conductive shell configured to couple to the sled to form the conductive surface.

8. The electronics assembly of claim 7, wherein:
the first electronic component comprises a motherboard having a processor and; and
the second electronic component comprises a display.

9. The electronics assembly of claim 8, wherein the motherboard further comprises an electrical interface connector configured to removably engage a docking connector coupled to an external device.

10. The electronics assembly of claim 9, further comprising:
a touchscreen proximate to a front surface of the display, the touchscreen comprising a controller that is coupled to the processor;
a backlight proximate to a back surface of the display, the backlight comprising an inverter that is coupled to the circuit matching element; and
an external cover configured to enclose the sled and conductive shell, the display, the backlight, and the touchscreen;
wherein the electronics assembly further comprises at least one mechanical attachment feature configured to retain the electrical interface connector in engagement with the docking connector.

11. The electronics assembly of claim 10, wherein the sled and external cover are configured such that the mechanical attachment feature is provided by coupling of the sled to an external structure, such that loads are transferred from the sled to the external structure without creating tension, bending, or shear stresses in the external cover.

12. The electronics assembly of claim 10, wherein the external cover does not provide EMI shielding.

13. An electronics assembly for removably connecting an electronic assembly to at least one external device while reducing EMI emissions, the electronics enclosure comprising:
a first electronic component comprising an output and an electrical interface connector configured to removably mate with a docking connector coupled to the at least one external device;
a second electronic component comprising an input having an input impedance;
a circuit matching element coupled between the output of the first electronic component and the input of the second electronic component, the circuit matching element configured to provide an output impedance that matches the input impedance of the second electronic component;
a conductive sled configured to accept the first electronic component and the circuit matching element;
a conductive cover configured to couple to the sled to form a volume, the first electronic component and the circuit matching element disposed within the volume;
wherein all non-conductive passages from the volume to the external environment have at least one cross-sectional opening having a continuous conductive perimeter with a maximum linear length within the opening of less than one quarter wavelength of a maximum shielding frequency.

14. The electronics assembly of claim 13, wherein:
the first electronic component comprises a motherboard having a processor; and
the second electronic component comprises a display.

15. The electronics assembly of claim 14, wherein:
the processor is coupled through the interface connector and the docking connector to a non-volatile memory;
the non-volatile memory is configured to store at least one configuration datum associated with the operation of the electronics assembly such that disconnection of a first electronics assembly and connection of a second electronics assembly does not require modification of the at least one configuration datum for the second electronics assembly to operate in the same manner as the first electronics assembly.

16. The electronics assembly of claim 14, wherein:
the second electronic component input is configured to accept a LVDS signal and has a characteristic input impedance; and
the circuit matching element output is configured to provide a LVDS signal and match the characteristic input impedance of the second electronic component input.

17. The electronics assembly of claim 16, wherein no inductive element is coupled to the line between the circuit matching element output and the second electronic component input.

18. The electronics assembly of claim 17, wherein no ferrite is coupled to the line between the circuit matching element output and the second electronic component input.

19. The electronics assembly of claim 13, wherein the maximum shielding frequency is at least 1 GHz.

20. An All-In-One (AIO) assembly for a medical device, the AIO assembly comprising:
a display unit having an input with an input impedance;
a conductive sled;
a motherboard coupled to the sled, the motherboard comprising a processor and a display driver;
a breakout board having an input coupled to the display driver and an output coupled to the input of the display, the breakout board output configured to provide an output impedance that matches the input impedance of the display;
a conductive cover coupled to the sled, the conductive cover configured to form a volume when coupled to the, the motherboard and the breakout board disposed within the volume;
wherein all non-conductive passages from the volume to the external environment have at least one cross-sectional opening having a continuous conductive perimeter with a maximum linear length within the opening of less than one quarter wavelength of a maximum shielding frequency.

21. The AIO assembly of claim 20, wherein:
the display input is configured to accept a LVDS signal and has a characteristic input impedance; and the breakout board output is configured to provide a LVDS signal and match the characteristic input impedance of the display input.

22. The AIO assembly of claim 21, wherein no inductive element is coupled to the line between the breakout board output and the display input.

23. The AIO assembly of claim 22, wherein no ferrite is coupled to the line between the breakout board output and the display input.

24. The AIO assembly of claim 20, wherein the motherboard further comprises an interface connector configured to removably engage a docking connector coupled to at least one external electronic device of the medical device.

25. The AIO assembly of claim 20, wherein the maximum shielding frequency is at least 1 GHz.

26. An Automated Dispensing Machine (ADM), comprising:
    a housing;
    at least one compartment coupled to the housing, the compartment configured to allow access to the contents of the compartment only after receipt of a signal;
    a docking connector; and
    an AIO assembly removably coupled to the housing, the AIO comprising:
        a display unit having an input with an input impedance;
        a conductive sled;
        a motherboard coupled to the sled, the motherboard comprising a processor, a display driver, and an electrical interface connector configured to removably mate with the docking connector;
        a breakout board having an input coupled to the display driver and an output coupled to the input of the display, the breakout board output configured to provide an output impedance that matches the input impedance of the display;
        a conductive cover coupled to the sled, the conductive cover configured to form a volume when coupled to the sled, the motherboard and the breakout board disposed within the volume;
    wherein all non-conductive passages from the volume to the external environment have at least one cross-sectional opening having a continuous conductive perimeter with a maximum linear length within the opening of less than one quarter wavelength of a maximum shielding frequency; and
    wherein the AIO assembly is configured to be removable from the ADM without disassembly of the external shell.

27. The ADM of claim 26, wherein:
    the display input is configured to accept a LVDS signal and has a characteristic input impedance; and
    the breakout board output is configured to provide a LVDS signal and match the characteristic input impedance of the display input.

28. The ADM of claim 27, wherein no inductive element is coupled to the line between the breakout board output and the display input.

29. The ADM of claim 28, wherein no ferrite is coupled to the line between the breakout board output and the display input.

30. The ADM of claim 26, further comprising a non-volatile memory coupled to the housing and electrically coupled to the processor through the docking connector and interface connector, the non-volatile memory configured to store at least one configuration datum associated with the operation of the ADM such that removal of a first AIO assembly and connection of a second AIO assembly enables the ADM to be function with the second AIO assembly in the same manner as the ADM previously functioned with the first AIO assembly without additional action.

31. The ADM of claim 26, wherein the maximum shielding frequency is at least 1 GHz.

* * * * *